(12) United States Patent
Ashkenazi

(10) Patent No.: US 6,175,722 B1
(45) Date of Patent: Jan. 16, 2001

(54) INITIAL FREQUENCY SYNCHRONIZATION MECHANISM

(75) Inventor: Rony Ashkenazi, Moshav Kidron (IL)

(73) Assignee: D.S.P.C. Technologies Ltd., Giv'at Shmuel (IL)

( * ) Notice: Under 35 U.S.C. 154(b), the term of this patent shall be extended for 0 days.

(21) Appl. No.: 09/012,361

(22) Filed: Jan. 23, 1998

(51) Int. Cl.⁷ .................................................. H04B 15/00
(52) U.S. Cl. ........................................ 455/62; 455/164.2
(58) Field of Search ........................... 455/62, 63, 164.1, 455/164.2, 188.1, 188.2, 189.1, 190.1, 192.2, 313, 316, 317, 318

(56) References Cited

U.S. PATENT DOCUMENTS

| | | | |
|---|---|---|---|
| 4,342,007 | * 7/1982 | Elliot | 455/164.1 |
| 4,715,001 | * 12/1987 | Deem et al. | 455/164.2 |
| 5,509,034 | * 4/1996 | Beukema | 455/164.2 |
| 5,933,059 | * 8/1999 | Asokan | 455/164.2 |

* cited by examiner

*Primary Examiner*—Reinhard J. Eisenzopf
*Assistant Examiner*—Sam Bhattacharia
(74) *Attorney, Agent, or Firm*—Eitan, Pearl, Latzer & Cohen-Zedek

(57) ABSTRACT

Method for acquiring frequency of a desired channel having a carrier frequency $F_{MAIN}$, for a dynamic receiver frequency $F_{MOBILE}$, from a starting frequency $F_{START}$, in the presence of high power adjacent interfering channels, wherein the starting frequency $F_{START}$ is shifted from $F_{MAIN}$ by not more than a predetermined frequency gap $\Delta F$, the method includes the steps of determining a first frequency boundary and a second frequency boundary, detecting channels within a filtering bandwidth, selecting a dominant channel from the detected channels, progressing the dynamic receiver frequency $F_{MOBILE}$ towards the carrier frequency of the dominant channel, detecting when the step of progressing has exceeded one of the first frequency boundary and the second frequency boundary, restarting the step of detecting channels, from the other of the one of the first frequency boundary and the second frequency boundary, and repeating from the step of detecting channels.

15 Claims, 8 Drawing Sheets

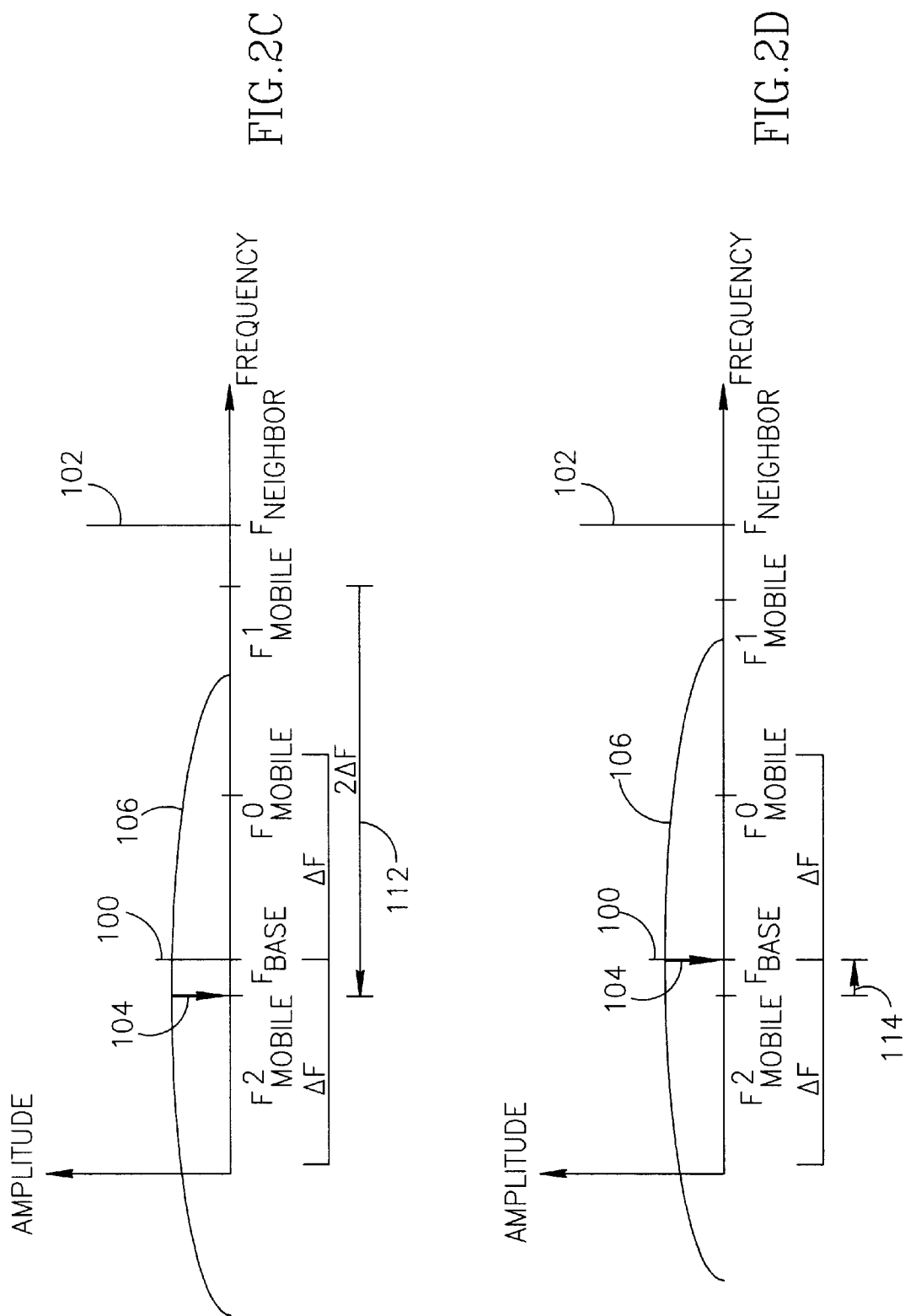

INITIAL FREQUENCY SYNCHRONIZATION MECHANISM

FIELD OF THE INVENTION

The present invention relates to frequency acquisition in general and to frequency acquisition in the presence of high power adjacent channels, in particular.

BACKGROUND OF THE INVENTION

Reference is now made to FIGS. 1A and 1B. FIG. 1A is a schematic illustration of frequency versus power, describing the initial stage of a initial frequency synchronization procedure, known in the art. The present example describes a closed loop automatic frequency control (AFC) mechanism.

FIG. 1B is a schematic illustration of frequency versus power, describing the final stage of the initial frequency synchronization procedure of FIG. 1A.

Arrow 14 represents the frequency of a mobile unit which detects and attempts to lock and synchronize with the carrier frequency 10 of a base unit transmitter having a value of $F_{BASE}$, which is located near by. In the present example the mobile unit further detects a carrier frequency 12 provided by a neighbor transmitter, having a value of $F_{NEIGHBOR}$. The value of the mobile unit $F_{MOBILE}$ is located between the values of the base unit frequency $F_{BASE}$ and the neighbor mobile transmitter frequency $F_{NEIGHBOR}$.

In the present example the mobile unit 14 detects the signals provided by base 10 and the neighbor 12 wherein the received power of the neighbor 12 is higher than the received power of the base unit 10.

According to conventional initial synchronization procedures, the mobile unit frequency is synchronized with the frequency having the highest received power, which in the present example is the neighbor frequency 12.

It will be noted that often the received frequencies are filtered so as to exclude undesired signals. Such a filter is represented by arc 16. These techniques often fail when the power of the undesired signal is significantly high.

Accordingly the synchronization mechanism of the mobile unit sets synchronization path towards the neighbor frequency $F_{NEIGHBOR}$ and starts progressing its frequency 14 towards $F_{NEIGHBOR}$. Finally the synchronization mechanism allows the frequency of the mobile unit 14 to acquire and synchronize with the frequency of the neighbor unit 12. This is shown in FIG. 1B by aligning line 12 and arrow 14. As can be seen, at this stage the frequency 10 of the base transmitter is filtered out by the filter 16.

A conventional synchronization mechanism provides frequency shifts within a limited range, determined by its structure, such as VCO voltage and the like. It will be appreciated by those skilled in the art that the $F_{NEIGHBOR}$ can be located outside this range. in such a case, $F_{MOBILE}$, might get stuck at the boundary frequency value which is closest to $F_{NEIGHBOR}$.

It will be appreciated by those skilled in the art that such situations, where the frequency of the mobile unit 14 is synchronized with the frequency of neighbor unit 12 instead of the frequency of the base unit 10, is not acceptable.

SUMMARY OF THE PRESENT INVENTION

It is an object of the present invention to provide a novel method for performing accurate initial frequency acquisition in the presence of high power adjacent channels.

It is a further object of the present invention to provide a novel device for performing accurate initial frequency acquisition in the presence of high power adjacent channels.

In accordance with the present invention there is thus provided a method for acquiring frequency of a desired channel having a carrier frequency $F_{MAIN}$, for a dynamic receiver frequency $F_{MOBILE}$, from a starting frequency $F_{START}$, in the presence of high power adjacent interfering channels.

The starting frequency $F_{START}$ is shifted from $F_{MAIN}$ by not more than a predetermined frequency gap $\Delta F$. The method includes the steps of:

determining a first frequency boundary and a second frequency boundary;

detecting channels within a filtering bandwidth;

selecting a dominant channel from the detected channels;

progressing the dynamic receiver frequency $F_{MOBILE}$ towards the carrier frequency of the dominant channel;

detecting when the step of progressing has exceeded one of the first frequency boundary and the second frequency boundary;

restarting the step of detecting channels, from the other of the one of the first frequency boundary and the second frequency boundary; and repeating from the step of detecting channels.

According to another aspect of the present invention, one of the first frequency boundary and the second frequency boundary is $F_{START}-\Delta F$, while the other is $F_{START}+\Delta F$.

The method of the invention can also include the step of determining a frequency advance direction. The frequency advance direction can be fixed at the beginning of each frequency acquisition cycle, wherein the frequency acquisition cycle is determined from the point where $F_{MOBILE}$ shifts from $F_{START}$ until the point where $F_{MOBILE}$ returns to $F_{START}$.

The step of progressing can be performed in a frequency step $F_{STEP}$. The value of the frequency step $F_{STEP}$ can be infinitesimal with comparison to the predetermined frequency gap $\Delta F$, or adjustable. Accordingly, the method can further include the step of adjusting the frequency step $F_{STEP}$ after each step of detecting channels.

In accordance with another aspect of the present invention, there is provided a device for acquiring frequency of a desired channel having a carrier frequency $F_{MAIN}$, for a dynamic receiver frequency $F_{MOBILE}$, from a starting frequency $F_{START}$, in the presence of high power adjacent interfering channels.

The device is connected to an antenna via a receiver and to a reference frequency $F_{REFERENCE}$ source. The device includes controllable frequency generating means for generating an internal frequency $F_{INTERNAL}$, frequency shift means connected to the controllable frequency generating means, and to the receiver, for shifting received frequency $F_{RECEIVED}$, of a received channel, according to the internal frequency $F_{INTERNAL}$.

The device also includes a frequency shift detector, connected to the frequency shift means, for detecting a frequency difference between the internal frequency $F_{INTERNAL}$ and the received frequency $F_{RECEIVED}$, with respect to the reference frequency $F_{REFERENCE}$, thereby producing a frequency shift value $F_{SHIFT}$.

The device further includes loop filtering means, connected to the frequency shift detector, for filtering the frequency shift value $F_{SHIFT}$, thereby producing a filtered frequency shift value $F_{SHIFT-FILTERED}$, and controlling means, connected to the controllable frequency generating means and to the loop filtering means, for determining a frequency step $F_{STEP}$ from the filtered frequency shift value $F_{SHIFT-FILTERED}$.

The controlling means provide the frequency shift value $F_{SHIFT}$ to the controllable frequency generating means. The controllable frequency generating means adjust the internal frequency $F_{INTERNAL}$ according to the frequency shift value $F_{SHIFT}$, and the controlling means control the controllable frequency generating means to generate frequency in a range from a first frequency boundary $F_{FIRST}$ and a second frequency boundary $F_{SECOND}$.

According to one aspect of the invention, the controlling means set the frequency shift value $F_{SHIFT}$ to be $F_{SECOND}-F_{INTERNAL}$, when $|F_{INTERNAL}-F_{START}|>|F_{INTERNAL}-F_{FIRST}|$ while the controlling means set the frequency shift value $F_{SHIFT}$ to be $F_{FIRST}-F_{INTERNAL}$, when $|F_{INTERNAL}-F_{START}|>|F_{INTERNAL}-F_{SECOND}|$.

According to another aspect of the invention, the device further includes frequency filtering means, connected between the frequency shift detector and frequency shift means.

The controlling means reset the loop filtering means when setting the frequency shift value $F_{SHIFT}$ to be $F_{SECOND}-F_{INTERNAL}$ or $F_{FIRST}-F_{INTERNAL}$.

BRIEF DESCRIPTION OF THE DRAWINGS

The present invention will be understood and appreciated more fully from the following detailed description taken in conjunction with the drawings in which:

FIG. 2C is a schematic illustration of frequency versus powers describing the third stage of a frequency synchronization procedure, operative in accordance with the present invention;

FIG. 2D is a schematic illustration of frequency versus power, describing the final stage of a frequency synchronization procedure, operative in accordance with the present invention;

DETAILED DESCRIPTION OF PREFERRED EMBODIMENTS

The present invention overcomes the disadvantages of the prior art by providing a frequency detect and fold mechanism. Accordingly, when the frequency shift exceeds a boundary value, then a predetermined frequency shift is enforced.

Figure 1A:
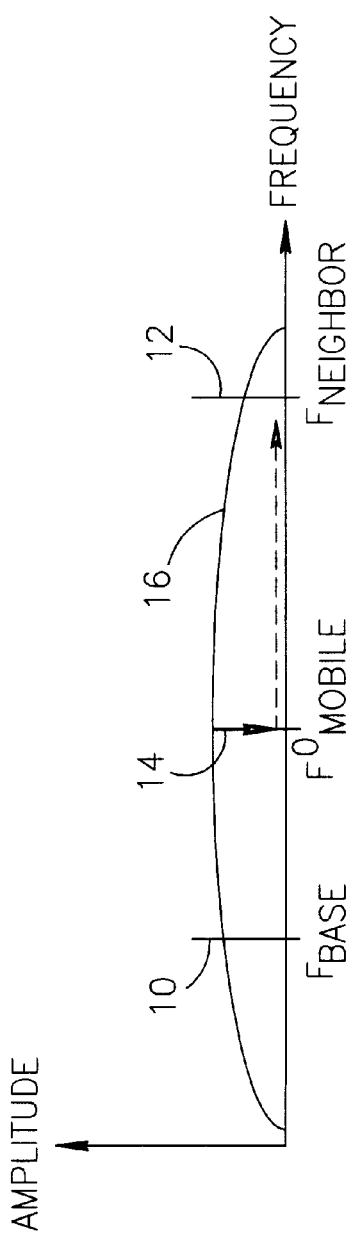
FIG. 1A is a schematic illustration of frequency versus power, describing the initial stage of a conventional initial frequency synchronization procedure.
Figure 1B:
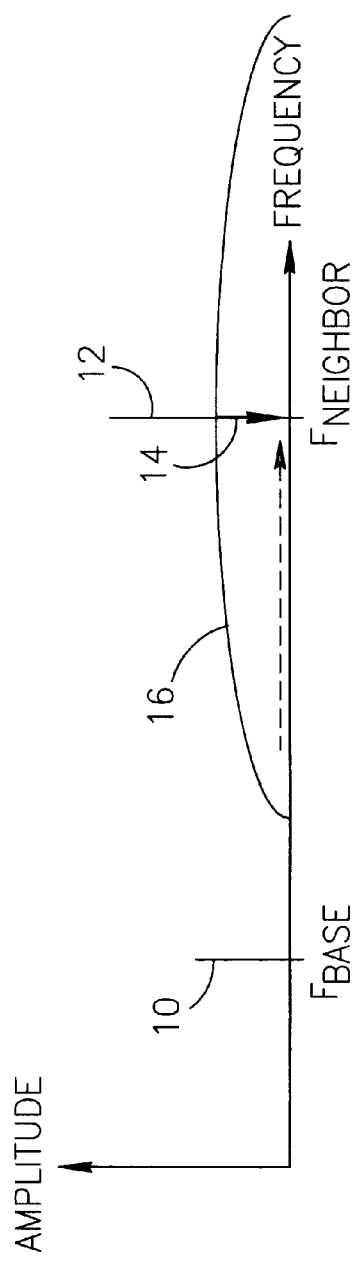
FIG. 1B is a schematic illustration of frequency power, describing the final stage of the initial frequency synchronization procedure of FIG. 1A.
Figure 2A:
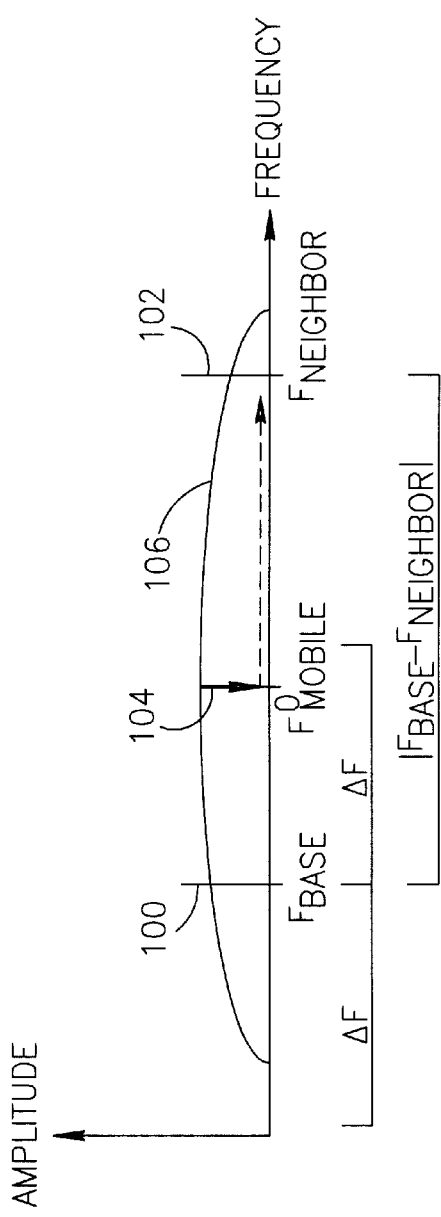
FIG. 2A is a schematic illustration of frequency versus power, describing the initial stage of a frequency synchronization procedure, operative in accordance with the present invention.
Figure 2B:
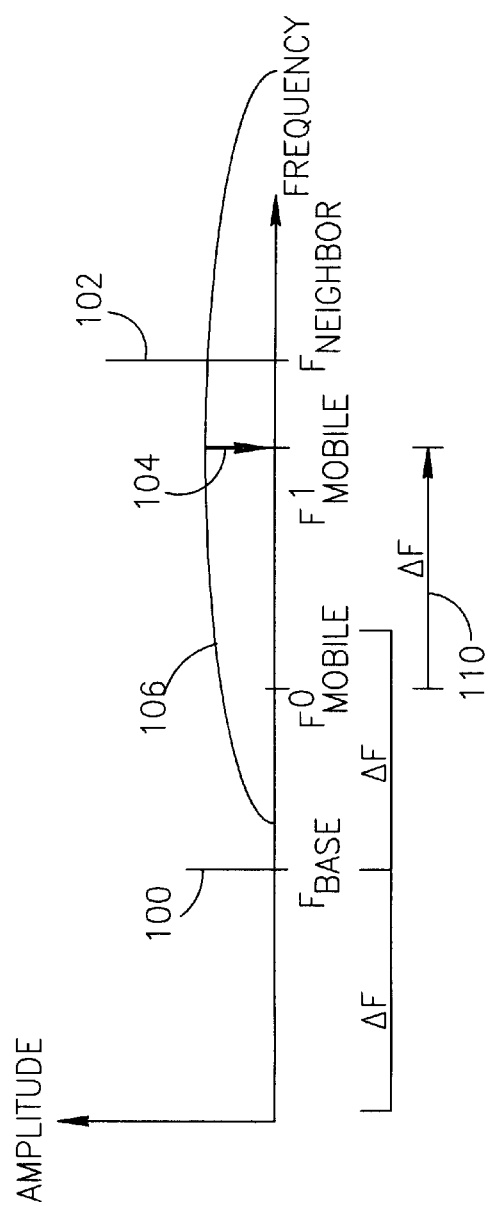
FIG. 2B is a schematic illustration of frequency versus power, describing the secondary stage of a frequency synchronization procedure, operative in accordance with the present invention.

Reference is now made to FIGS. 2A, 2B, 2C and 2D. FIG. 2A is a schematic illustration of frequency versus power, describing the initial stage of a frequency synchronization procedure, operative in accordance with the present invention. FIG. 2B is a schematic illustration of frequency versus power, describing the secondary stage of a frequency synchronization procedure, operative in accordance with the present invention. FIG. 2C is a schematic illustration of frequency versus power, describing the third stage of a frequency synchronization procedure, operative in accordance with the present invention. FIG. 2D is a schematic illustration of frequency versus power, describing the final stage of a frequency synchronization procedure, operative in accordance with the present invention.

The schematic illustration provided by FIG. 2A describes the frequency 100 of a base station, having a value $F_{BASE}$, a frequency 104 of a mobile unit, having an initial value $F^0_{MOBILE}$, and a frequency 102 of a neighbor transmitter, having the value of $F^0_{NEIGHBOR}$, wherein $$F_{BASE} \circ F_{MOBILE} < F_{NEIGHBOR}.$$

In conventional communication standards, such as AMPS, NAMPS, JTACS, NTACS, USDC-TDMA and the like, the initial value of $F^0_{MOBILE}$ of the mobile unit frequency 104 can be shifted from the value $F_{BASE}$ of the base station frequency 100, by no more than a predetermined frequency gap $\Delta F$. Another condition set by these standards is that any neighbor transmitter will transmit in a frequency $F_{NEIGHBOR}$, which is considerably shifted from $F_{BASE}$. Accordingly $|F_{BASE}-F_{NEIGHBOR}|>2\Delta F$.

The method of the present invention generally searches the received spectrum within a frequency range of $[F^0_{MOBILE}-\Delta F, F^0_{MOBILE}+\Delta F]$, for stabilized frequency values.

According to the invention, at the initial stage (i.e., at frequency $F^0_{MOBILE}$) the mobile unit detects all of the signals of transmitters in its vicinity and detects the frequency of the signal with the highest received power, which in the present example is the neighbor transmitted frequency 102. Accordingly, the mobile unit commences shifting its frequency 104 from the value of $F^0_{MOBILE}$, towards the value $F_{NEIGHBOR}$ of neighbor transmitter frequency 102.

The present invention makes use of the above limitations, of conventional communication standards, which outline that the initial value $F^0_{MOBILE}$ of the mobile unit frequency 104 has to be within a frequency gap of $\Delta F$ from the value $F_{BASE}$, of the base transmitter frequency 100.

Accordingly, any shift from the initial stage $F^0_{MOBILE}$, cannot exceed the value of $\Delta F$. After the frequency 104 of the mobile unit has progressed towards the neighbor transmitter frequency 102 value $F_{NEIGHBOR}$, by a frequency shift 110, having a value of $\Delta F$, to the value $F^1_{MOBILE}$, then, according to the invention, any further progress in this direction would result in a detection error and hence, should not be pursued.

At this stage, the present invention determines a reversed path 112 for frequency 104 (FIG. 2C) for shifting frequency 104 from the value of $F^1_{MOBILE}$ to the value of $F^2_{MOBILE}$ wherein the shift value of this reverse path 112, is a frequency gap which is twice the value of $\Delta F$.

At the final stage (FIG. 2D) the spectrum is searched, thereby detecting the base frequency 100 as the dominant signal. Accordingly, the mobile unit 104 commences shifting its frequency towards base frequency 100, from the value of $F^{2MOBILE}$ to $F_{BASE}$. This shift is shown by path 114. According to the present example, no direction is enforced for path 114.

It will be noted that applying a filter, such as filter 106, improves the performance of an initial synchronization process, according to the invention. As illustrated in FIG. 2C, as long as the filter size is less than $|F_{BASE}-F_{NEIGHBOR}| \times 2$, (provided that the filter is generally symmetrical), wherein $F_{NEIGHBOR}$ is not a high power signal, then, $F_{NEIGHBOR}$ would not be detected as a major signal by the receiver of the mobile unit, in the original direction of progress.

Figure 3:
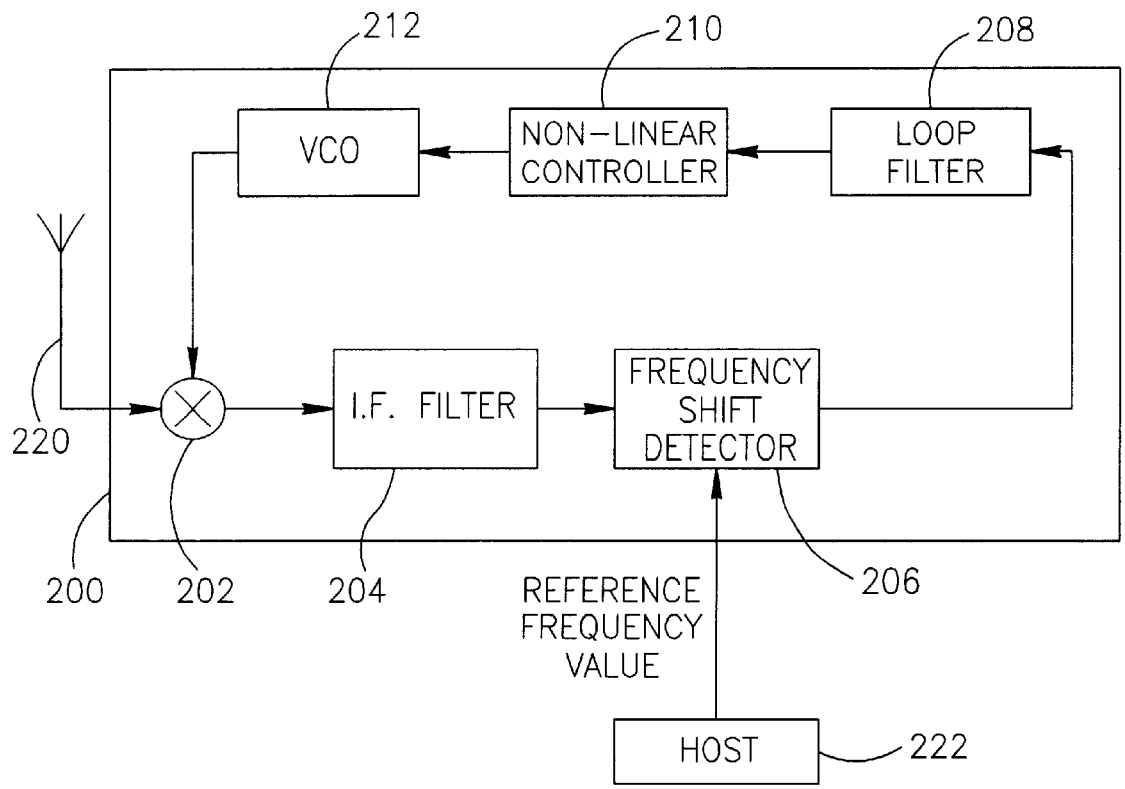
FIG. 3 is a schematic illustration of a device for synchronizing frequencies, constructed and operative in accordance with another preferred embodiment of the invention.

Reference is now made to FIG. 3 which is a schematic illustration of a device for synchronizing frequencies, generally referenced 200, constructed and operative in accordance with another preferred embodiment of the invention.

Device 200 includes a frequency shift unit 202, an intermediate frequency (I.F.) filter 204 connected to the frequency shift unit 202, a frequency shift detector 206 connected to the I.F. filter 204, a loop filter 208 connected to the frequency shift detector 206, a non-linear controller 210 connected to the loop filter 208, and a voltage control oscillator (VCO) 212, connected to the non-linear controller 210 and to the frequency shift unit 202. It will be noted that VCO 212 can be replaced with any type of controlled oscillator. The frequency shift unit 202 is further connected to an antenna 220. The frequency shift detector 206 is further connected to a host 222. The host 222 provides a reference frequency value to the frequency shift detector 206.

The antenna 220 detects frequency signals of neighbor transmitters wherein one of these detected frequency signals is transmitted by a base station. The antenna 220 provides these received frequency signals to the frequency shift unit 202. The VCO 212 generates a signal having a frequency and provides it to frequency shift unit 202.

Frequency shift unit 202 shifts frequencies, received from antenna 220, according to the frequency provided by the VCO and provides the results to the I.F. filter 204. The I.F. filter 204 filters some of these frequencies and provides the remaining ones to the frequency shift detector 206. The frequency shift detector 206 attempts to detect the frequency shift of each of these shifted frequencies from the reference frequency value, provided by the host 222.

Accordingly, the frequency shift detector 206 determines a frequency shift value and provides it to the loop filter 208. The loop filter 208 includes the history of the frequency shifts performed by device 200 and accordingly determines a frequency shift direction and provides it with the frequency shift value to the non-linear controller 210.

The non-linear controller 210 detects if the overall shift, up until this stage has exceeded the value of $\Delta F$. If so, then the non-linear controller 210 provides VCO 212 with the command to generate a reversed frequency shift such as the one according to path 112 (FIG. 2C). If not, then the non-linear control 210 provides the VCO 212 with a frequency shift value and a frequency shift direction for further shifting the frequency towards the most dominant received frequency. Then the VCO 212 provides a new shift frequency to the frequency shift unit 202 and the process is repeated from the beginning.

It will be noted that when using a slow loop filter, such as software implemented loop filter, it would be difficult for such a loop filter to process a considerable shift such as the one defined by path 112, since such shifts are compared to frequency behavior history contained therein.

According to a further aspect of the invention, when the non-linear controller 210 determines a $2\Delta F$ shift, it also sends a clear command back to the loop filter 208, thereby erasing the frequency history contained in the memory of loop filter 208. This operation enables the loop filter 208 to further process considerable frequency shifts.

It will be noted that the terms base, mobile and neighbor are presented as a matter of convenience only. The present invention is applicable for any type of initial frequency acquisition in the presence of a high power adjacent channels, wherein the base of the above example is assigned to a main transmitter, the mobile of the above example is assigned to a receiver and the neighbor of the above example is assigned to an adjacent interfering transmitter.

It will be noted that each of the main transmitter, the adjacent transmitter and the receiver may be implemented for a mobile unit, a base unit and the like.

Figure 4:
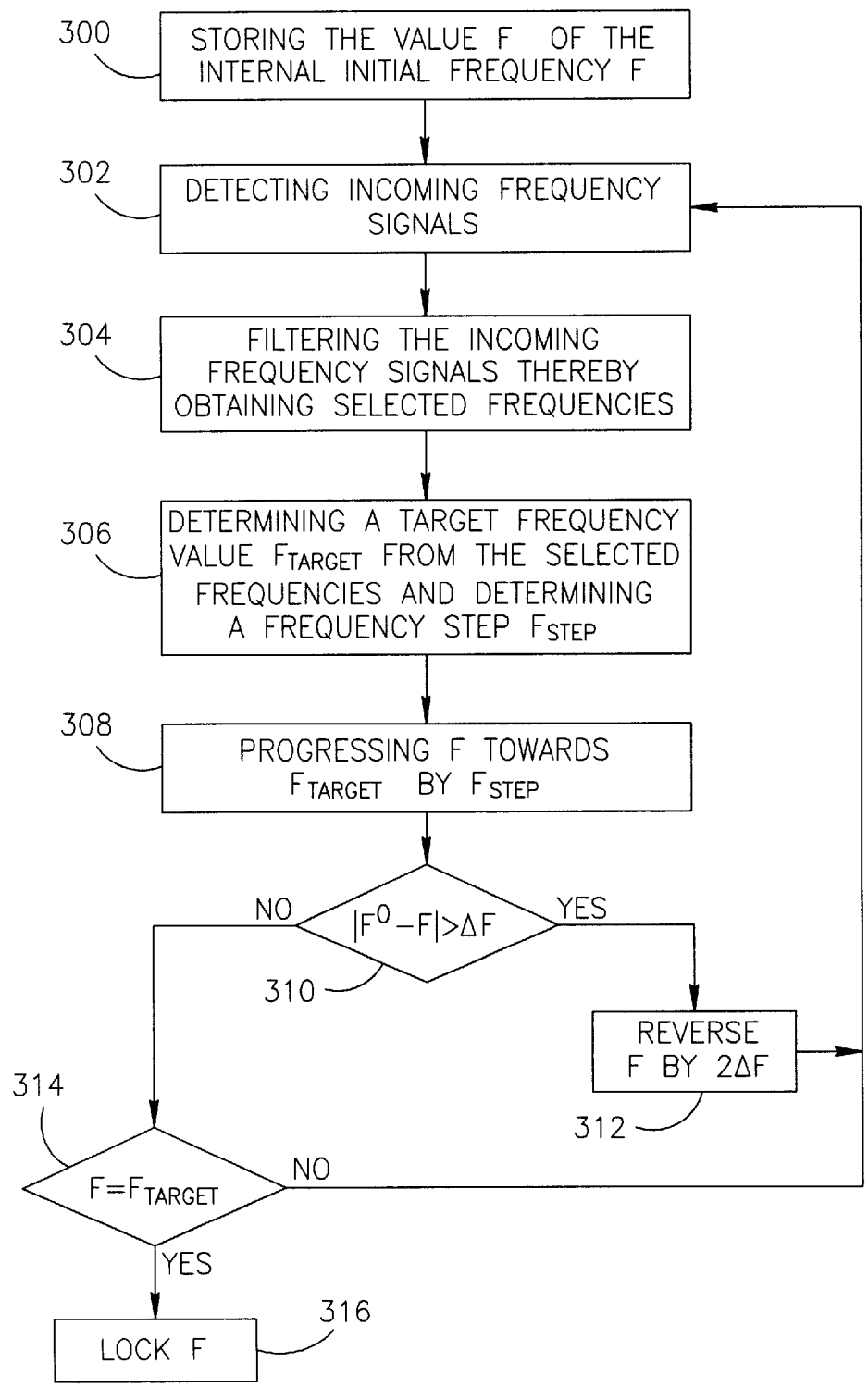
FIG. 4 is a schematic illustration of a method for operating the device of FIG. 3, operative in accordance with a further embodiment of the invention.

Reference is now made to FIG. 4 which is a schematic illustration of a method for operating the device 200 of FIG. 3, operative in accordance with a further embodiment of the invention.

In step 300, the device 200 stores the value $F_0$ of the internal initial frequency F. $F^0$ is used to determine, later on, the total amount of shift from the initial frequency. It will be noted that for this purpose, the device 200 can store and accumulate the values of the later frequency shifts, instead.

In step 302, the device 200 detects incoming frequency signals.

In step 304, the device 200 filters the incoming frequency signals, thereby obtaining selected frequencies.

In step 306, the device 200 determines a target frequency value $F_{TARGET}$, from the selected frequencies. In the present example (FIG. 2A), the device 200 (FIG. 3) selects the right side signal 102 ($F_{NEIGHBOR}$), as the target frequency $F_{TARGET}$.

In step 308, the device 200 progresses the internal frequency F towards the target frequency $F_{TARGET}$ by a predetermined frequency step $F_{STEP}$. It will be noted that $F_{STEP}$ can be determined using a range of considerations, such as speed, accuracy and the like. In general, $F_{STEP}$ is determined to be significantly smaller than $\Delta F$, thereby yielding higher accuracy. It will further be noted that $F_{STEP}$ can be infinitesimal thereby yielding an analog like behavior.

In step 310, the device 200 detects if the internal frequency F was shifted beyond a gap of $\Delta F$. If so, then the device 200 proceeds to step 312. Otherwise, the device 200 proceeds to step 314.

In step 312, the device 200 reverses F by $2\Delta F$. In the present example (FIG. 2C), reverse path 112, describes such a reverse shift, from the value of $F^1_{MOBILE}$ to the value of $F^2_{MOBILE}$. Then, the device 200 repeats the steps of the above method, from step 302.

It will be noted that at this stage, signal 102 appears to be outside of the filtering bandwidth of filter 106, thereby leaving the base station frequency signal 100, the strongest, at the output of filter 106. Accordingly, the device 200 determines $F_{BASE}$ as $F_{TARGET}$.

In step 314, the device 200 detects if the internal frequency F is synchronized with the target frequency $F_{TARGET}$.

If so, then the device 200 has completed the initial frequency acquisition procedure and accordingly, locks the frequency F (step 316). Otherwise, the device 200 repeats the steps of the above method, from step 302.

The method of FIG. 4 overcomes a situation where there exists interfering neighbor frequencies such as $F_{NEIGHBOR}$ (reference numeral 102) on one side of the spectrum.

In a situation where there exist interfering neighbor frequencies on both sides of the base frequency $F_{BASE}$, the present invention provides a slightly different solution, as will be disclosed hereinbelow.

Figure 2E:
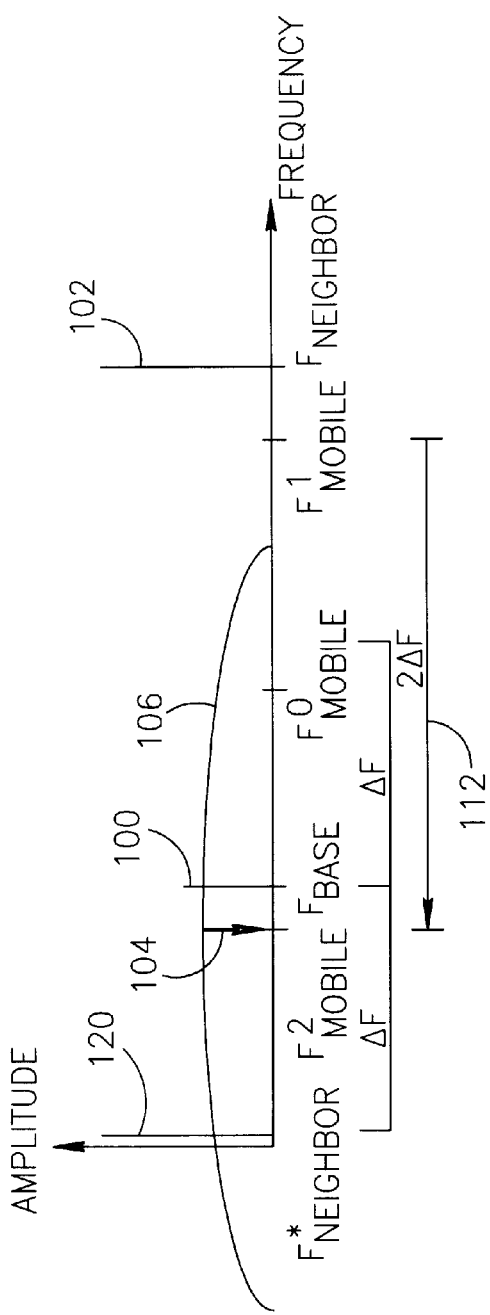
FIG. 2E is a schematic illustration of frequency versus power, describing the third stage of a frequency synchronization procedure, operative in accordance with another aspect of the present invention.
Figure 2F:
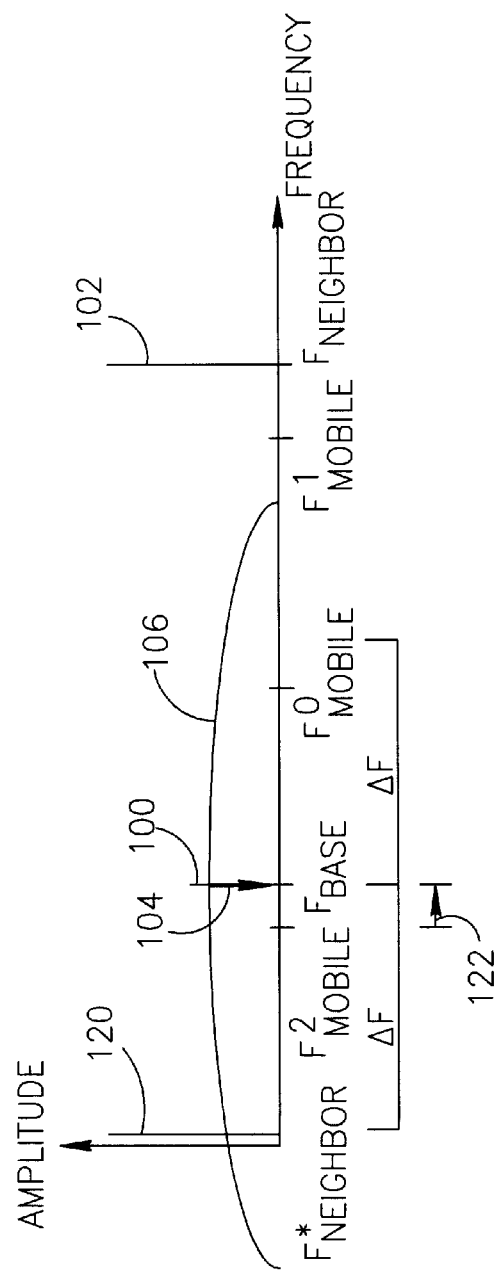
FIG. 2F is a schematic illustration of frequency versus power, describing the final stage of a frequency synchronization procedure, operative in accordance with another aspect of the present invention.

Reference is now made to FIGS. 2E and 2F. FIG. 2E is a schematic illustration of frequency versus power, describing a stage of a frequency synchronization procedure, operative in accordance with another aspect of the present invention. FIG. 2F is a schematic illustration of frequency versus power, describing a final stage of a frequency synchronization procedure, operative in accordance with another aspect of the present invention.

According to the present example, there exists an additional neighbor frequency 120 having a value of $F^*_{NEIGHBOR}$, on the left side of the base frequency 100 $F_{BASE}$. When the mobile frequency completes the $2\Delta F$ frequency shift 112, additional neighbor frequency 120 falls within the filtering bandwidth of filter 106, together with base frequency 100.

It will be noted that if, at the output of filter 106, the signal of the additional neighbor frequency 120 appears to be stronger than the signal of the base frequency 100, then, according to the method of FIG. 3, the mobile frequency 104 would be drawn towards the additional neighbor frequency 120.

According to another aspect of the present invention, the initial direction set forth in the second stage (i.e., the direction of frequency shift 110, (FIG. 2B)), is stored. In the present example, this direction is from left to right.

Then, after the mobile frequency completes the $2\Delta F$ frequency shift 112, the acquisition mechanism continues searching in that initial direction, only. It will be noted that such forced search direction provides an accurate acquisition of the desired base frequency, in one or less search cycle.

In a more detailed form, at the final stage (FIG. 2F) the spectrum is searched again in the direction set forth in the initial stage (i.e., the direction of shift 110), thereby detecting the base frequency 100 as the dominant signal. Accordingly, a path 122 is set towards base frequency 100, for shifting mobile frequency 104 from the value of $F^2_{MOBILE}$ to $F_{BASE}$.

It will be noted that the present invention provides a search shift step which can be calibrated at each search stage. For example, on the one hand, in the presence of a powerful additional neighbor 120, frequency shift 122 may include a large number of infinitesimal frequency shift steps. Otherwise, frequency shift 122 may include a small number of larger frequency shift steps.

Figure 5A:
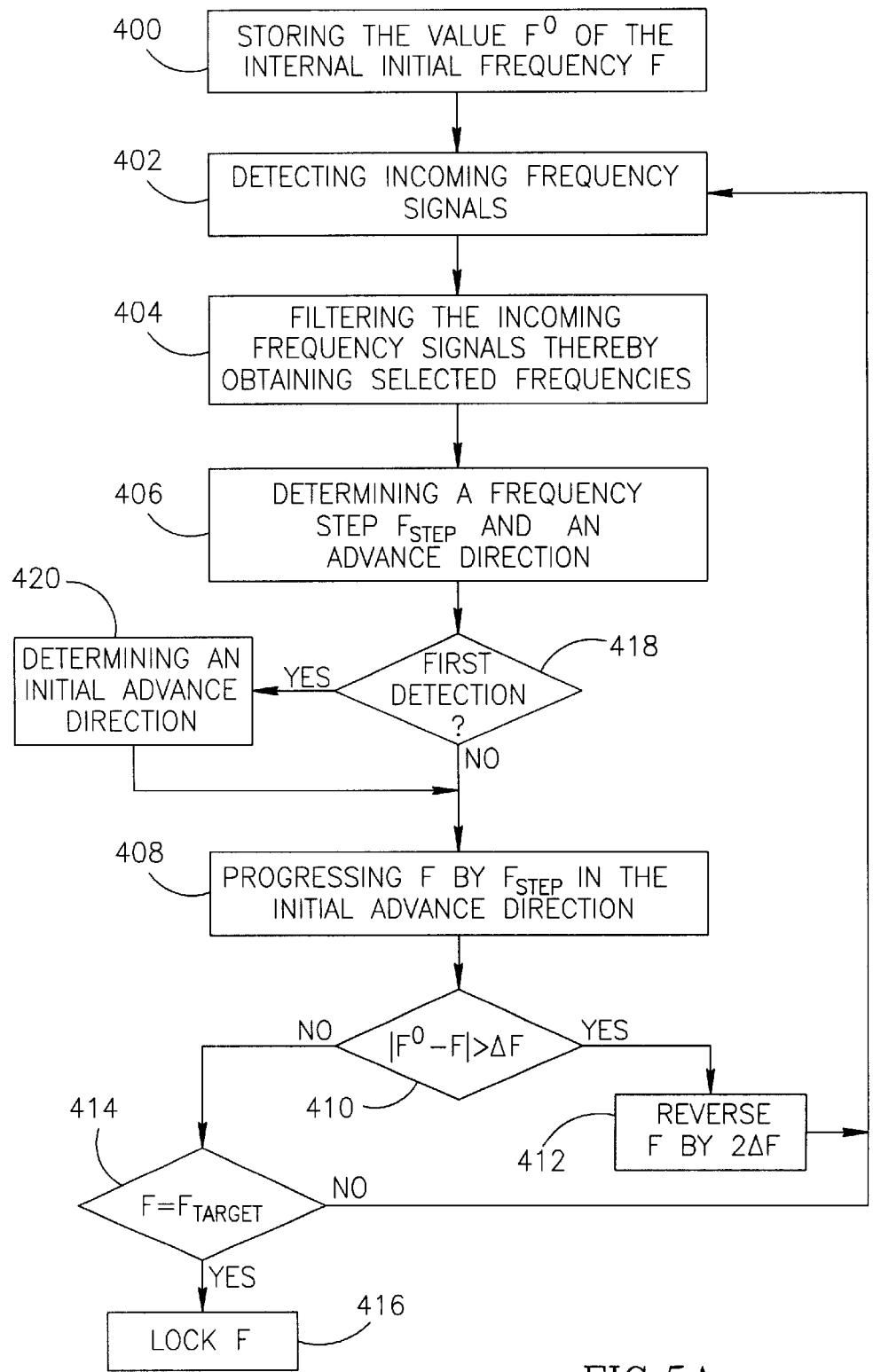
FIG. 5A is a schematic illustration of a method for operating the device of FIG. 3, operative in accordance with yet another embodiment of the invention.
Figure 5B:
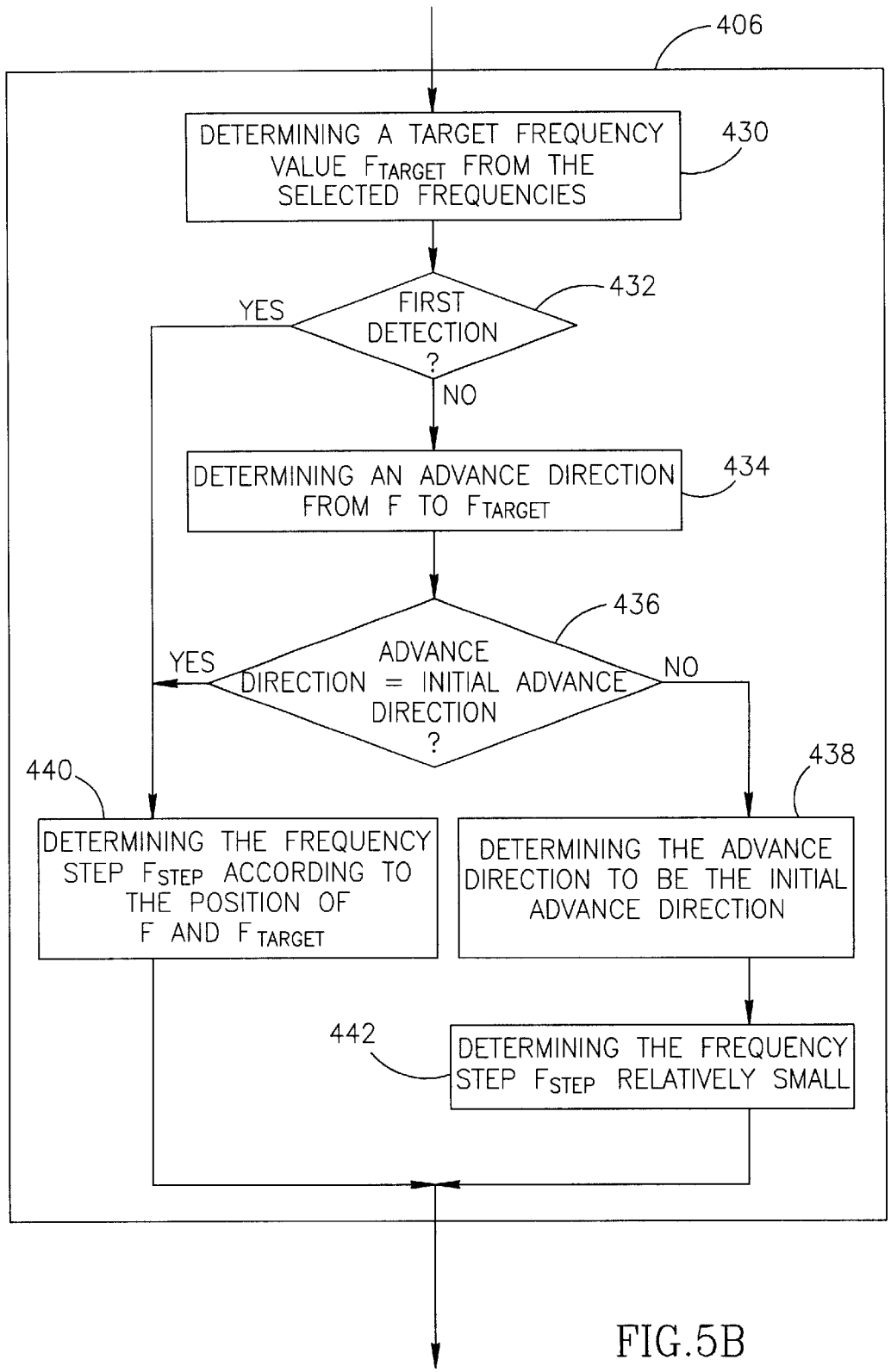
FIG. 5B is a schematic illustration in detail of a step of the method of FIG. 5A.

Reference is now made to FIGS. 5A and 5B. FIG. 5A is a schematic illustration of a method for operating the device 200 of FIG. 3, operative in accordance with yet another embodiment of the invention. FIG. 5B is a schematic illustration in detail of step 406 of the method of FIG. 5A.

In step 400, the device 200 stores the value $F^0$ of the internal initial frequency F.

In step 402, the device 200 detects incoming frequency signals.

In step 404, the device 200 filters the incoming frequency signals, thereby obtaining selected frequencies.

In step 406, the device 200 determines frequency step $F_{STEP}$ and a frequency advance direction, in a way which is described in detail in FIG. 5B.

In step 418, if the detection performed according to step 402 is the first detection in the current acquisition cycle, then the device 200 proceeds to step 420. Otherwise, the device 200 proceeds to step 408.

In step 420, the device 200 determines an initial advance direction which will be constant during the present acquisition cycle, and proceeds to step 408.

In step 408, the device 200 progresses the internal frequency F by frequency step $F_{STEP}$, in the advance direction.

In step 410, the device 200 detects if the internal frequency F was shifted beyond a gap of $\Delta F$. If so, then the device 200 proceeds to step 412. Otherwise, the device 200 proceeds to step 414.

In step 412, the device 200 reverses F by $2\Delta F$. In the present example (FIG. 2E), reverse path 112, describes such a reverse shift, from the value of $F^1_{MOBILE}$ to $F^2_{MOBILE}$. Then, the device 200 repeats the steps of the above method, from step 402.

It will be noted that at this stage, additional neighbor frequency signal 120 falls within the filtering bandwidth of filter 106, which poses a problem if additional neighbor frequency signal 120 appears stronger than the base station signal 100, at the output of filter 106.

Referring now to FIG. 5B, the device 200 determines a target frequency value $F_{TARGET}$ from the selected frequencies (step 430). In the present example, when the mobile frequency is at a value of $F^0_{MOBILE}$ (FIG. 2A), the device 200 (FIG. 3) selects the right side signal 102 ($F_{NEIGHBOR}$), as the target frequency $F_{TARGET}$. Alternatively, when the mobile frequency is at a value of $F^2_{MOBILE}$ (FIG. 2E), the device 200 (FIG. 3) selects the left side signal 120 ($F^*_{NEIGHBOR}$), as the target frequency $F_{TARGET}$.

In step 432, if the detection performed according to step 402 is the first detection in the current acquisition cycle, then, the device 200 proceeds to step 440. Otherwise, the device 200 proceeds to step 434.

In step 434, the device 200 determines an advance direction from the mobile frequency value F and the target frequency value $F_{TARGET}$.

In step 436, if the advance direction determined in step 434 is equal to the initial advance direction, determined in step 420, then the device 200 proceeds to step 440. Otherwise, the device 200 proceeds to step 438. It will be noted that a situation where these directions are not equal occurs, for example, when a neighbor signal, such as the one of additional neighbor frequency 120, appears to be stronger than the signal of the base frequency 100, at the output of the filter 106.

In step 440, the device 200 determines the frequency step $F_{STEP}$ according to the position of F and $F_{TARGET}$. In the present example, $F_{STEP} \leq |F - F_{TARGET}|$.

In step 438, the device 200 determines the advance direction to be the initial advance direction.

In step 442, the device 200 determines the frequency step $F_{STEP}$ relatively small. It will be noted that, according to the present example, the size of $F_{STEP}$ is smaller, compared to the size of $\Delta F$.

Referring back to FIG. 5A, wherein if the device 200 detects if the internal frequency F is synchronized with the target frequency $F_{TARGET}$ (step 414), then the device 200 proceeds to step 416 and locks F. Otherwise, the device 200 repeats the steps of the above method, from step 402.

Hence, the method of FIGS. 5A and 5B overcomes a situation where there exist interfering neighbor frequencies such as $F_{NEIGHBOR}$ (reference numeral 102) and $F^*_{NEIGHBOR}$ (reference numeral 120) on either side of the $F_{BASE}$.

It will be appreciated by persons skilled in the art that the present invention is not limited to what has been particularly shown and described hereinabove. Rather the scope of the present invention is defined by the claims which follow.

What is claimed is:

1. A method for acquiring frequency of a desired signal comprising:

detecting signals within a filtering bandwidth centered at a dynamic receiver frequency;

progressing said dynamic receiver frequency in an advance direction towards the carrier frequency of a dominant signal of said detected signals; and when said dynamic receiver frequency has progressed from a starting frequency in said advance direction by a predetermined frequency gap, shifting said dynamic receiver frequency in the opposite direction to said advance direction by two of said predetermined frequency gap.

2. The method of claim 1 wherein said progressing is performed in a frequency step.

3. The method of claim 2 wherein said dynamic starting frequency is shifted from the carrier frequency of the desired signal by not more than said predetermined frequency gap and wherein the value of said frequency step is infinitesimal with comparison to said predetermined frequency gap.

4. The method of claim 2 further comprising adjusting said frequency step after each said detecting signals.

5. The method of claim 1 wherein said dynamic starting frequency is shifted from the carrier frequency of the desired signal by not more than said predetermined frequency gap.

6. The method of claim 1 wherein said advance direction is fixed at the beginning of each frequency acquisition cycle, wherein said frequency acquisition cycle is determined from the point where said dynamic receiver frequency shifts from said starting frequency until the point where said dynamic receiver frequency returns to said starting frequency.

7. The method of claim 1 further comprising progressing said dynamic receiver frequency in said advance direction towards the carrier frequency of the desired signal.

8. A method for acquiring frequency of a desired channel having a carrier frequency $F_{MAIN}$, for a dynamic receiver frequency $F_{MOBILE}$, from a starting frequency $F_{START}$, in the presence of high power adjacent interfering channels, wherein $F_{START}$ is shifted from $F_{MAIN}$ by not more than a predetermined frequency gap $\Delta F$, the method comprising the steps of:

determining a first frequency boundary and a second frequency boundary;

detecting channels within a filtering bandwidth;

selecting a dominant channel from said detected channels;

determining a frequency advance direction;

progressing said dynamic receiver frequency $F_{MOBILE}$ towards the carrier frequency of said dominant channel;

detecting when said step of progressing has exceeded one of said first frequency boundary and said second frequency boundary;

restarting said step of detecting channels, from the other of said one of said first frequency boundary and said second frequency boundary; and repeating from said step of detecting channels, wherein said frequency advance direction is fixed at the beginning of each frequency acquisition cycle, wherein said frequency acquisition cycle is determined from the point where $F_{MOBILE}$ shifts from $F_{START}$ until the point where $F_{MOBILE}$ returns to $F_{START}$.

9. A device for acquiring frequency of a desired channel having a carrier frequency $F_{MAIN}$, for a dynamic receiver frequency $F_{MOBILE}$, from a starting frequency $F_{START}$, in the presence of high power adjacent interfering channels, wherein $F_{START}$ is shifted from $F_{MAIN}$ by not more than a predetermined frequency gap $\Delta F$, the device being connected to an antenna via a receiver and to a reference frequency $F_{REFERENCE}$ source, the device comprising:

controllable frequency generating means for generating an internal frequency $F_{INTERNAL}$;

frequency shift means connected to said controllable frequency generating means, and to said receiver, for shifting received frequency $F_{RECEIVED}$, of a received channel, according to said internal frequency $F_{INTERNAL}$;

a frequency shift detector, connected to said frequency shift means, for detecting a frequency difference between said internal frequency $F_{INTERNAL}$ and said received frequency $F_{RECEIVED}$, with respect to said reference frequency $F_{REFERENCE}$, thereby producing a frequency shift value $F_{SHIFT}$;

loop filtering means, connected to said frequency shift detector, for filtering said frequency shift value $F_{SHIFT}$, thereby producing a filtered frequency shift value $F_{SHIFT-FILTERED}$; and controlling means, connected to said controllable frequency generating means and to said loop filtering means, for determining a frequency step $F_{STEP}$ from said filtered frequency shift value $F_{SHIFT-FILTERED}$, wherein said controlling means provide said frequency shift value $F_{SHIFT}$ to said controllable frequency generating means, wherein said controllable frequency generating means adjust said internal frequency $F_{INTERNAL}$ according to said frequency shift value $F_{SHIFT}$, and wherein said controlling means control said controllable frequency generating means to generate frequency in a range from a first frequency boundary $F_{FIRST}$ and a second frequency boundary $F_{SECOND}$.

10. The device according to claim 9 wherein said controlling means set said frequency shift value $F_{SHIFT}$ to be $F_{SECOND} - F_{INTERNAL}$, when $|F_{INTERNAL} - F_{START}| \geq |F_{INTERNAL} - F_{FIRST}|$.

11. The device according to claim 8 wherein said controlling means set said frequency shift value $F_{SHIFT}$ to be $F_{FIRST} - F_{INTERNAL}$, when $|F_{INTERNAL} - F_{START}| \geq |F_{INTERNAL} - F_{SECOND}|$.

12. The device according to claim 9 further comprising frequency filtering means, connected between said frequency shift detector and frequency shift means.

13. The device according to claim 10 wherein said controlling means reset said loop filtering means when setting said frequency shift value $F_{SHIFT}$ to be $F_{SECOND} - F_{INTERNAL}$.

14. The device according to claim 11 wherein said controlling means reset said loop filtering means when setting said frequency shift value $F_{SHIFT}$ to be $F_{FIRST} - F_{INTERNAL}$.

15. A device comprising:

controllable frequency generating means for generating an internal frequency;

frequency shift means coupled to said controllable frequency generating means for shifting a received frequency of a received signal according to said internal frequency;

a frequency shift detector coupled to said frequency shift means adapted to detect a frequency difference between said internal frequency and said received frequency with respect to a reference frequency, and adapted to produce a frequency shift value therefrom;

loop filtering means coupled to said frequency shift detector for filtering said frequency shift value and for producing a filtered frequency shift value; and controlling means coupled to said controllable frequency generating means and to said loop filtering means for determining a frequency step from said filtered frequency shift value.

* * * * *